United States Patent
Takama (10) Patent No.: US 10,912,241 B2
(45) Date of Patent: Feb. 2, 2021

(54) COMPONENT MOUNTING DEVICE

(71) Applicant: YAMAHA HATSUDOKI KABUSHIKI KAISHA, Iwata (JP)

(72) Inventor: Kazushi Takama, Iwata (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 253 days.

(21) Appl. No.: 15/571,923

(22) PCT Filed: Jun. 19, 2015

(86) PCT No.: PCT/JP2015/067707
§ 371 (c)(1),
(2) Date: Nov. 6, 2017

(87) PCT Pub. No.: WO2016/203639
PCT Pub. Date: Dec. 22, 2016

(65) Prior Publication Data
US 2018/0098468 A1    Apr. 5, 2018

(51) Int. Cl.
*H05K 13/08* (2006.01)
*H05K 13/04* (2006.01)
*H05K 3/30* (2006.01)

(52) U.S. Cl.
CPC ..... *H05K 13/0812* (2018.08); *H05K 13/0409* (2018.08); *H05K 13/0413* (2013.01);
(Continued)

(58) Field of Classification Search
CPC .... H05K 13/0812; H05K 3/301; H05K 3/303; H05K 2203/16; H05K 2203/163;
(Continued)

(56) References Cited

U.S. PATENT DOCUMENTS 5,249,349 A * 10/1993 Kuinose ............. H05K 13/0812
29/721
6,317,972 B1    11/2001 Asai et al.
6,389,688 B1 *  5/2002 Srivastava ......... H05K 13/0812
29/833
(Continued)

FOREIGN PATENT DOCUMENTS

CN    1842269 A    10/2006
JP    H05-167300 A    7/1993
(Continued)

OTHER PUBLICATIONS

Machine Translation of Japanese Patent Publication, JP 2014-216621, Dec 2019. (Year: 2014).*
(Continued)

*Primary Examiner* — A. Dexter Tugbang
(74) *Attorney, Agent, or Firm* — Studebaker & Brackett PC (57) ABSTRACT

A component mounting device includes a mounting head that mounts a component at a mounting position on a substrate, an imaging unit capable of imaging the mounting position from a plurality of fields of view, imaging directions of which are different from each other, and a controller that selects a success or failure determination field of view used for success or failure determination of whether or not the component has been mounted at the mounting position from the plurality of fields of view according to a state of a shield around the mounting position.

10 Claims, 7 Drawing Sheets

(52) U.S. Cl.
CPC ........... *H05K 13/08* (2013.01); *H05K 13/081* (2018.08); *H05K 13/0815* (2018.08); *H05K 3/301* (2013.01); *H05K 3/303* (2013.01); *H05K 2203/16* (2013.01); *H05K 2203/163* (2013.01); *Y10T 29/49131* (2015.01); *Y10T 29/53174* (2015.01); *Y10T 29/53191* (2015.01)

(58) Field of Classification Search
CPC ............... H05K 13/08; H03K 13/0409; H03K 13/0413; H03K 13/081; H03K 13/0815; Y10T 29/49131; Y10T 29/53174; Y10T 29/53191
See application file for complete search history.

(56) References Cited

U.S. PATENT DOCUMENTS

| | | | | |
|---|---|---|---|---|
| 2003/0110610 A1* | 6/2003 | Duquette | ........... | H05K 13/0812 29/407.09 |
| 2006/0075631 A1* | 4/2006 | Case | ................ | H05K 13/0812 29/709 |
| 2006/0096086 A1* | 5/2006 | Coots | ................ | H05K 13/0812 29/834 |
| 2009/0119904 A1* | 5/2009 | Yamasaki | ......... | H05K 13/0812 29/593 |

FOREIGN PATENT DOCUMENTS

| | | |
|---|---|---|
| JP | H06-045796 A | 2/1994 |
| JP | 2005-537630 A | 12/2005 |
| JP | 2007-511094 A | 4/2007 |
| JP | 2007-214460 A | 8/2007 |
| JP | 2008-098411 A | 4/2008 |
| JP | 2008-103426 A | 5/2008 |
| JP | 2008-516453 A | 5/2008 |
| JP | 2009004468 A * | 1/2009 |
| JP | 2014-093390 A | 5/2014 |
| JP | 2014-216621 A | 11/2014 |

OTHER PUBLICATIONS

International Search Report issued in PCT/JP2015/067707; dated Sep. 29, 2015.

Written Opinion issued in PCT/JP2015/067707; dated Sep. 29, 2015.

An Office Action issued by the State Intellectual Property Office dated Jun. 17, 2019, which corresponds to Japanese Patent Application No. 201580080244.8 and is related to U.S. Appl. No. 15/571,923; with English Translation.

* cited by examiner

FIG.3  IMAGING UNIT

FIG.11
MEASUREMENT OF SUBSTRATE SURFACE HEIGHT

FIG.12

COMPONENT MOUNTING DEVICE

CROSS REFERENCE TO RELATED APPLICATIONS

This application claims benefit of priority to International Patent Application No. PCT/JP2015/067707 filed Jun. 19, 2015, the entire content of which is incorporated herein by reference.

TECHNICAL FIELD

The present disclosure relates to a component mounting device and a component mounting determination method for this component mounting device, and more particularly, it relates to a component mounting device capable of imaging the mounting position of a component on a substrate and a component mounting determination method for this component mounting device.

BACKGROUND

In general, a component mounting device capable of imaging the mounting position of a component on a substrate is known. Such a component mounting device is disclosed in Japanese Patent Laying-Open No. 2014-93390, for example.

The aforementioned Japanese Patent Laying-Open No. 2014-93390 discloses an electronic component mounting device including a suction nozzle that suctions an electronic component and mounts the suctioned electronic component on a substrate, a camera that images the mounting position, on the substrate, of the electronic component mounted on the substrate by the suction nozzle, and a controller that examines (determines) whether or not the electronic component has been normally mounted at the mounting position based on an image of the mounting position captured by the camera.

SUMMARY

Technical Problem

However, in the electronic component mounting device disclosed in the aforementioned Japanese Patent Laying-Open No. 2014-93390, when a shield such as another tall electronic component is present around the mounting position on the substrate, the shield shields the field of view of the camera, and the mounting position cannot conceivably be accurately imaged. In this case, it is a problem to reliably determine whether or not the electronic component has been mounted at the mounting position.

The present disclosure has been proposed in order to solve the aforementioned problem, and an object of the present disclosure is to provide a component mounting device and a component mounting determination method for a component mounting device each capable of stably determining whether or not a component has been mounted at a mounting position.

Solution to Problem

A component mounting device according to a first aspect of the present disclosure includes a mounting head that mounts a component at a mounting position on a substrate, an imaging unit capable of imaging the mounting position from a plurality of fields of view, imaging directions of which are different from each other, and a controller that selects a success or failure determination field of view used for success or failure determination of whether or not the component has been mounted at the mounting position from the plurality of fields of view according to a state of a shield around the mounting position.

In the component mounting device according to the first aspect of the present disclosure, the controller is configured as described above such that even when the mounting position cannot be accurately imaged from one field of view due to the shield, the controller can select, as the success or failure determination field of view, the other of the plurality of fields of view less affected by shielding of the shield than one of the plurality of fields of view. Consequently, a success or failure determination can be made based on an imaging result from the field of view less affected by shielding of the shield, and hence it can be stably determined whether or not the component has been mounted at the mounting position.

In the aforementioned component mounting device according to the first aspect, the controller is preferably configured to acquire a degree of shielding of the shield in each of the plurality of fields of view according to the state of the shield around the mounting position and to select the success or failure determination field of view from the plurality of fields of view based on the acquired degree of shielding in each of the plurality of fields of view. In the present disclosure, the term "degree of shielding" indicates a wider concept including the sizes of regions of the plurality of fields of view shielded by the shield, the percentages of the regions shielded by the shield, etc. According to this structure, the other of the plurality of fields of view less affected by shielding of the shield than one of the plurality of fields of view can be reliably selected as the success or failure determination field of view. Consequently, it can be more stably determined whether or not the component has been mounted at the mounting position.

In this case, the degree of shielding preferably includes a shielding percentage, which is a percentage of a size of a shielded portion of the component shielded by the shield to a total size of the component, and the controller is preferably configured to select the success or failure determination field of view from the plurality of fields of view based on the shielding percentage in each of the plurality of fields of view. According to this structure, the success or failure determination field of view can be selected in consideration of not only the size of the shielded portion but also the total size of the component generally varying from type to type, unlike the case where the success or failure determination field of view is selected based on only the size of the shielded portion. Consequently, the influence of shielding of the shield can be more appropriately evaluated, and hence the success or failure determination field of view less affected by shielding of the shield can be more reliably selected.

In the aforementioned component mounting device according to the first aspect, the shield around the mounting position preferably includes at least one of the component before mounting suctioned by the mounting head, the component mounted on the substrate around the mounting position, and the mounting head that has suctioned the component. According to this structure, the controller can select the success or failure determination field of view according to the state of the component before mounting suctioned by the mounting head, the component mounted on the substrate around the mounting position, or the mounting head that has suctioned the component, which is likely to be a shield that shields the fields of view. Consequently, the controller can reliably select, as the success or failure determination field of view, the field of view less affected by shielding of the shield from the plurality of fields of view.

In the aforementioned component mounting device according to the first aspect, the plurality of fields of view, the imaging directions of which are different from each other, are preferably positioned such that the imaging directions thereof are at different inclination angles from each other with respect to a substrate surface of the substrate on which the component is mounted. According to this structure, the mounting position can be imaged at the different inclination angles, and hence the field of view less affected by shielding of the shield can be easily set in any of the plurality of fields of view.

In this case, the plurality of fields of view, the imaging directions of which are different from each other, are preferably positioned adjacent to each other in a vertical plane with respect to the substrate surface. According to this structure, the plurality of fields of view can be compactly positioned as compared with the case where the plurality of fields of view are positioned apart from each other in a direction parallel to the substrate surface. Consequently, the field of view less affected by shielding of the shield can be easily set in any of the plurality of fields of view while an increase in the size of the imaging unit is suppressed.

In the aforementioned component mounting device according to the first aspect, the imaging unit preferably includes an imaging section that images the mounting position, and a first optical system that divides a field of view of the imaging section into the plurality of fields of view, the imaging directions of which are different from each other. According to this structure, unlike the case where the plurality of fields of view are imaged with a plurality of imaging sections, the plurality of fields of view can be imaged with the single imaging section. Consequently, the plurality of fields of view can be imaged while complication of the structure of the imaging section of the imaging unit is suppressed.

In this case, the mounting head preferably includes a plurality of mounting heads, the first optical system of the imaging unit preferably includes a plurality of first optical systems that correspond in number to the plurality of mounting heads, and the imaging unit preferably further includes a second optical system that divides the field of view of the imaging section into each of the plurality of first optical systems. According to this structure, unlike the case where the plurality of fields of view are imaged for each mounting head with a plurality of imaging sections, the plurality of fields of view can be imaged for each mounting head with the single imaging section. Consequently, the plurality of fields of view can be imaged for each mounting head while complication of the structure of the imaging section of the imaging unit is suppressed.

In the aforementioned component mounting device according to the first aspect, the controller is preferably configured to acquire, from the imaging unit, respective captured images from the plurality of fields of view and to select, from the acquired respective captured images from the plurality of fields of view, a captured image from the success or failure determination field of view according to the state of the shield around the mounting position. According to this structure, the controller can easily select, as the success or failure determination field of view, the other of the plurality of fields of view less affected by shielding of the shield than one of the plurality of fields of view, and hence it can be easily and stably determined whether or not the component has been mounted at the mounting position.

In the aforementioned component mounting device according to the first aspect, the controller is preferably configured to select the success or failure determination field of view from the plurality of fields of view according to at least one of a type of the component to be mounted at the mounting position and a background of the component around the mounting position in addition to the state of the shield around the mounting position. According to this structure, the success or failure determination field of view can be selected also in consideration of at least one of the type of the component to be mounted at the mounting position and the background around the mounting position, and hence the field of view less affected by shielding of the shield, from which more features of the component can be imaged, can be easily selected.

In the aforementioned component mounting device according to the first aspect, the imaging unit is preferably configured to image the mounting position before mounting of the component and the mounting position after mounting of the component from each of the plurality of fields of view, and the controller is preferably configured to make the success or failure determination based on a captured image of the mounting position before mounting of the component from the success or failure determination field of view and a captured image of the mounting position after mounting of the component from the success or failure determination field of view, both of which have been selected from respective captured images from the plurality of fields of view. According to this structure, the controller can easily make the success or failure determination based on the selected captured images of the mounting position before and after mounting of the component from the success or failure determination field of view.

In the aforementioned component mounting device according to the first aspect, the controller is preferably configured to acquire a height of a substrate surface of the substrate with respect to a reference surface based on a captured image of the mounting position from each of the plurality of fields of view and to correct a determination region used for the success or failure determination in a captured image from the success or failure determination field of view based on the acquired height of the substrate surface. According to this structure, even when the height of the substrate surface of the substrate with respect to the reference surface changes due to warpage of the substrate, for example, such that the mounting position is positionally deviated with respect to the determination region, the controller can appropriately make the success or failure determination by correcting the determination region.

A component mounting determination method for a component mounting device according to a second aspect of the present disclosure includes mounting, by a mounting head, a component at a mounting position on a substrate, imaging, by an imaging unit, the mounting position from a plurality of fields of view, imaging directions of which are different from each other, and selecting, by a controller, a success or failure determination field of view used for success or failure determination of whether or not the component has been mounted at the mounting position from the plurality of fields of view according to a state of a shield around the mounting position.

The component mounting determination method for a component mounting device according to the second aspect of the present disclosure includes the step performed by the controller described above such that it can be stably determined whether or not the component has been mounted at the mounting position, similarly to the case of the aforementioned component mounting device according to the first aspect.

Effect of the Disclosure

According to the present disclosure, as hereinabove described, the component mounting device and the component mounting determination method for a component mounting device each capable of stably determining whether or not the component has been mounted at the mounting position can be provided.

DETAILED DESCRIPTION

An embodiment embodying the present disclosure is hereinafter described on the basis of the drawings.

Present Embodiment (Structure of Component Mounting Device)

The structure of a component mounting device 100 according to the present embodiment of the present disclosure is now described with reference to FIGS. 1 and 2.

Figure 1:
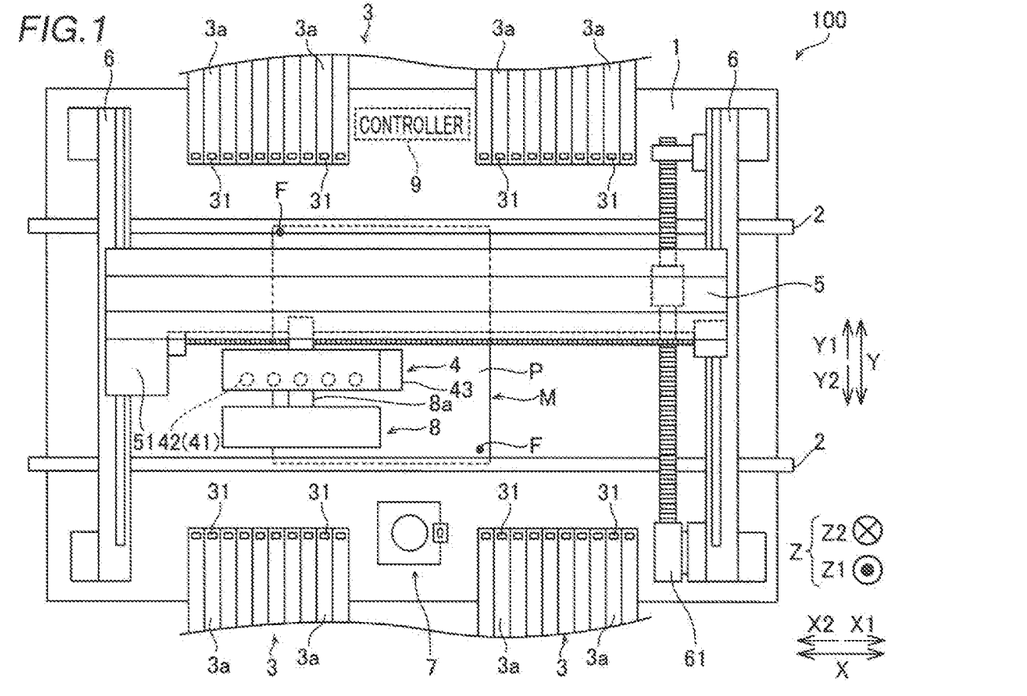
FIG. 1 is a diagram showing the overall structure of a component mounting device according to an embodiment of the present disclosure.

As shown in FIG. 1, the component mounting device 100 is a component mounting device that conveys a substrate P from an X1 side to an X2 side by a pair of conveyors 2 and mounts components 31 on the substrate P at a mounting operation position M.

The component mounting device 100 includes a base 1, the pair of conveyors 2, component feeders 3, a head unit 4, a support 5, a pair of rails 6, a component recognition camera 7, an imaging unit 8, and a controller 9.

The pair of conveyors 2 are installed on the base 1 and are configured to convey the substrate P in a direction X. In addition, the pair of conveyors 2 are configured to hold the substrate P being conveyed in a stopped state at the mounting operation position M. Moreover, the pair of conveyors 2 are configured such that an interval therebetween in a direction Y can be adjusted according to the dimensions of the substrate P.

The component feeders 3 are disposed on both outer sides (Y1 and Y2 sides) with respect to the pair of conveyors 2. A plurality of tape feeders 3a are attached to the component feeders 3.

The tape feeders 3a hold reels (not shown) on which tapes that hold a plurality of components 31 at a predetermined interval are wound. The tape feeders 3a are configured to feed the components 31 from the tips of the tape feeders 3a by rotating the reels to feed the tapes that hold the components 31. Here, the components 31 are a concept used to indicate electronic components such as ICs, transistors, capacitors, and resistors.

The head unit 4 is disposed above the pair of conveyors 2 and the component feeders 3, and includes a plurality of (five) mounting heads 42 including nozzles 41 (see FIG. 2) at their lower ends and a substrate recognition camera 43.

The mounting heads 42 are configured to be movable up and down, and are configured to suction and hold the components 31 fed from the tape feeders 3a by negative pressure generated at the tips of the nozzles 41 by a negative pressure generator (not shown) and to mount the components 31 at mounting positions Pa (see FIG. 2) on the substrate P.

The substrate recognition camera 43 is configured to image fiducial marks F of the substrate P in order to recognize the position of the substrate P. The positions of the fiducial marks F are imaged and recognized such that the mounting positions Pa of the components 31 on the substrate P can be accurately acquired.

The support 5 includes a motor 51. The support 5 is configured to move the head unit 4 in the direction X along the support 5 by driving the motor 51. Both ends of the support 5 are supported by the pair of rails 6.

The pair of rails 6 are fixed on the base 1. A rail 6 on the X1 side includes a motor 61. The rails 6 are configured to move the support 5 in the direction Y perpendicular to the direction X along the pair of rails 6 by driving the motor 61. The head unit 4 is movable in the direction X along the support 5, and the support 5 is movable in the direction Y along the rails 6 such that the head unit 4 is movable in the directions X and Y.

The component recognition camera 7 is fixed on the upper surface of the base 1. The component recognition camera 7 is configured to image the components 31 suctioned by the nozzles 41 of the mounting heads 42 from the lower side (Z2 side) in order to recognize the suction states (suction attitudes) of the components 31 prior to mounting of the components 31. Thus, the controller 9 can acquire the suction states of the components 31 suctioned by the nozzles 41 of the mounting heads 42.

The imaging unit 8 is mounted on the head unit 4 by an imaging unit support 8a. Thus, the imaging unit 8 is configured to move in the directions X and Y together with the head unit 4 as the head unit 4 moves in the directions X and Y. Furthermore, as shown in FIG. 2, the imaging unit 8 is configured to image a mounting position Pa from a first field of view V1 and a second field of view V2, the imaging directions of which are different from each other, in order for the controller 9 to make a success or failure determination of whether or not a component 31 has been normally mounted at the mounting position Pa. The first field of view V1 and the second field of view V2 are fields of view from which a predetermined region including the mounting position Pa can be imaged. The structure of this imaging unit 8 is described later in detail.

As shown in FIG. 1, the controller 9 includes a CPU, and is configured to control the overall operation of the component mounting device 100 such as an operation of conveying the substrate P performed by the pair of conveyors 2, a mounting operation performed by the head unit 4, and imaging operations performed by the component recognition camera 7 and the imaging unit 8.

(Structure of Imaging Unit)

The structure of the imaging unit 8 is now described in detail with reference to FIGS. 2 to 5.

Figure 2:
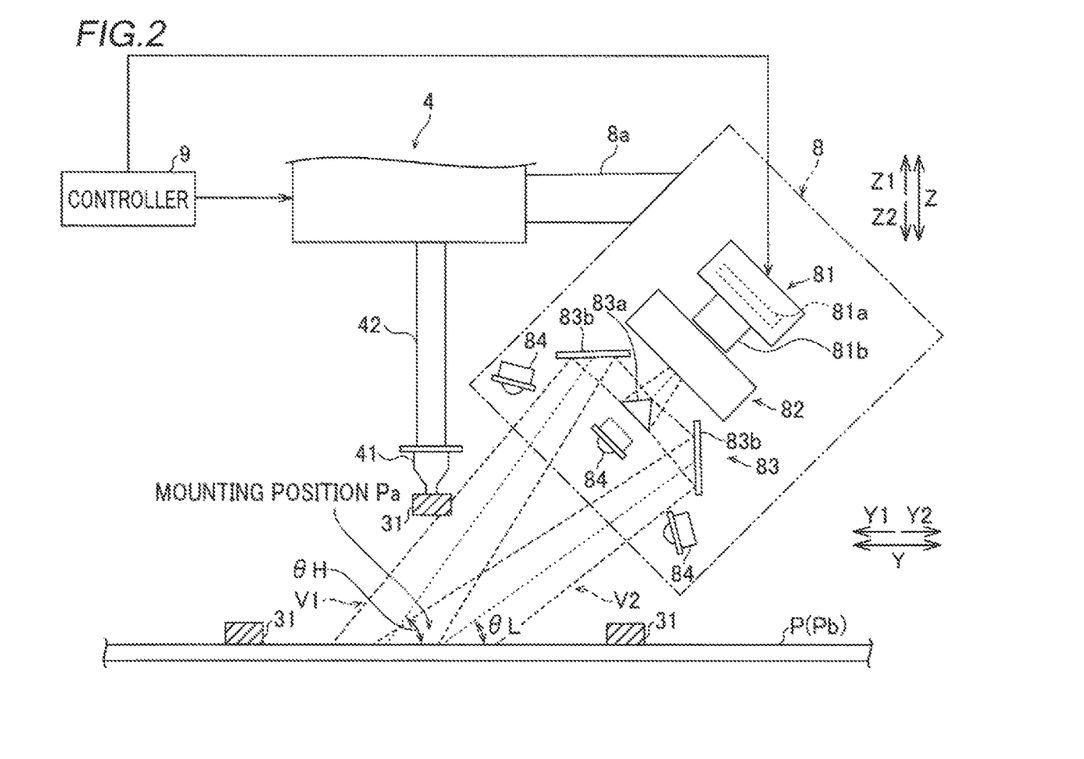
FIG. 2 is a schematic view of a head unit and an imaging unit of the component mounting device according to the embodiment of the present disclosure, as viewed from the side.
Figure 3:
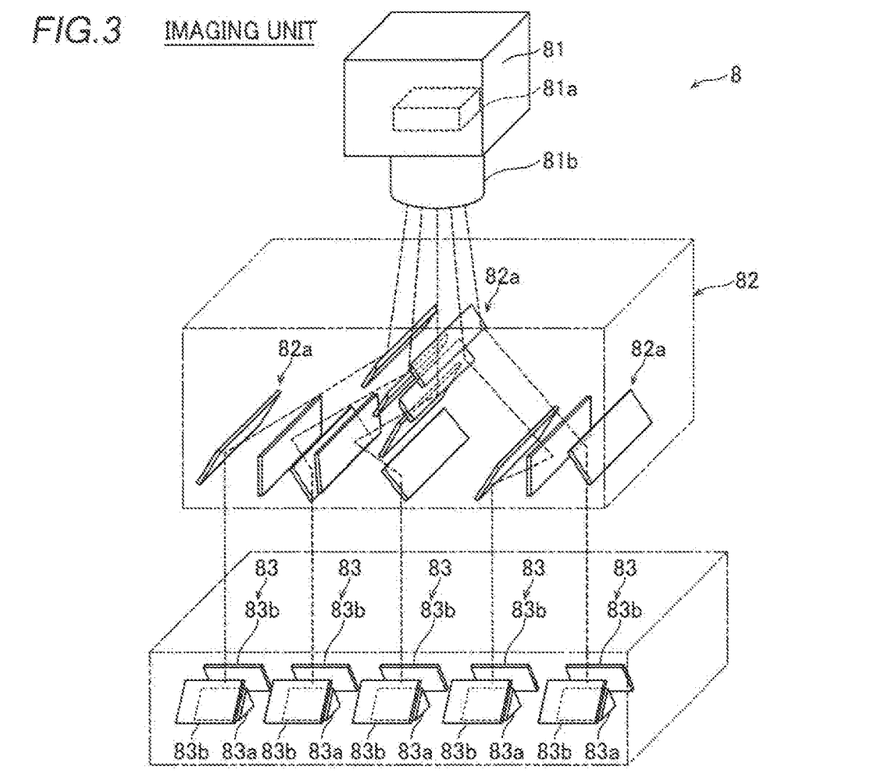
FIG. 3 is a schematic perspective view for illustrating the overall structure of the imaging unit of the component mounting device according to the embodiment of the present disclosure.

As shown in FIGS. 2 and 3, the imaging unit 8 includes a success or failure determination camera 81, an optical system 82, a plurality of (five) optical systems 83, and illumination sections 84. The success or failure determination camera 81 is an example of an "imaging section" in the present disclosure. The optical system 82 and the optical systems 83 are examples of a "second optical system" and a "first optical system" in the present disclosure, respectively.

The success or failure determination camera 81 includes an imaging element 81a and a lens 81b. The success or failure determination camera 81 is configured to image an object such as the mounting position Pa by converting light incident through the lens 81b into an electric signal by the imaging element 81a.

As shown in FIG. 3, the optical system 82 includes a plurality of mirrors 82a. The optical system 82 is configured to divide the field of view of the success or failure determination camera 81 into each of the plurality of (five) optical systems 83 by changing an optical path by the plurality of mirrors 82a. The plurality of mirrors 82a are disposed such that the optical path lengths of optical paths from the success or failure determination camera 81 to the optical systems 83 are substantially the same as each other. Thus, a clear image with little blurring can be easily captured even when the object is imaged from any of the optical paths.

The plurality of (five) optical systems 83 correspond in number to the plurality of (five) mounting heads 42. Each of the plurality of optical systems 83 includes a prism 83a and a pair of mirrors 83b. As shown in FIG. 2, the optical systems 83 each are configured to further divide the field of view of the success or failure determination camera 81 divided by the optical system 82 into the first field of view V1 and the second field of view V2 by the prism 83a. The optical systems 83 each are configured to change, by each of the pair of mirrors 83b, optical paths of the first field of view V1 and the second field of view V2 divided by the prism 83a to angles at which the mounting position Pa can be imaged.

Specifically, in each of the optical systems 83, a mirror 83b on the upper side (Z1 side) is disposed so as to change the optical path of the first field of view V1 such that the mounting position Pa can be imaged from an imaging direction with an inclination angle $\theta H$ (0 degrees<$\theta H$<90 degrees) with respect to a substrate surface Pb of the substrate P on which the component 31 is mounted. Furthermore, in each of the optical systems 83, a mirror 83b on the lower side (Z2 side) is disposed so as to change the optical path of the second field of view V2 such that the mounting position Pa can be imaged from an imaging direction with an inclination angle $\theta L$ (0 degrees<$\theta L$<$\theta H$) with respect to the substrate surface Pb of the substrate P on which the component 31 is mounted.

Consequently, the first field of view V1 and the second field of view V2 are positioned such that the imaging directions thereof have different inclination angles ($\theta H$ and $\theta L$) from each other with respect to the substrate surface Pb. In addition, the first field of view V1 and the second field of view V2 having different inclination angles from each other are positioned adjacent to each other in a vertical plane (in a YZ plane) including the mounting position Pa with respect to the substrate surface Pb. The first field of view V1 is a field of view in which the mounting position Pa can be imaged from the upper side (Z1 side) (higher position), and the second field of view V2 is a field of view in which the mounting position Pa can be imaged from the lower side (lower position) of the first field of view V1.

One set of (three) illumination sections 84 is provided for each of the plurality of optical systems 83. In addition, the illumination sections 84 each include a light source such as an LED (light-emitting diode), and are configured to illuminate the mounting position Pa at the timing when the mounting position Pa is imaged by the success or failure determination camera 81. In FIG. 3, illustration of the illumination sections 84 is omitted.

With these configurations, the imaging unit 8 can image the mounting position Pa from the first field of view V1 and the second field of view V2 for each of the mounting heads 42 from oblique directions with the inclination angles $\theta H$ and $\theta L$ with respect to the substrate surface Pb by the single success or failure determination camera 81.

Figure 4:
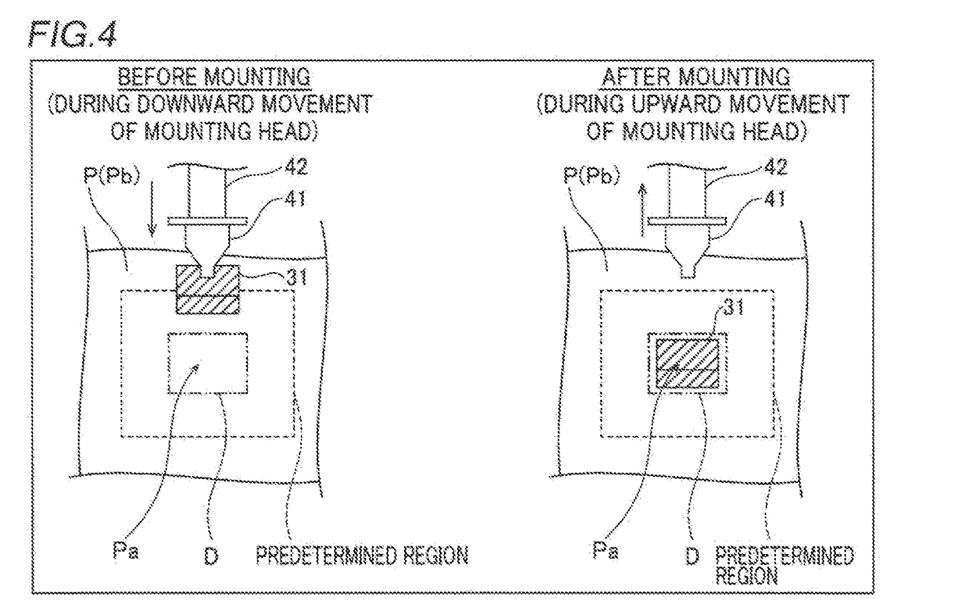
FIG. 4 is a diagram for illustrating an imaging status before mounting of a component and an imaging status after mounting of the component through the imaging unit of the component mounting device according to the embodiment of the present disclosure.

As shown in FIG. 4, the imaging unit 8 is configured to image a predetermined region (shown by a broken line) including the mounting position Pa before mounting of the component 31 and a predetermined region (shown by a broken line) including the mounting position Pa after mounting of the component 31 from each of the first field of view V1 and the second field of view V2 in order for the controller 9 to make a success or failure determination of whether or not the component 31 has been normally mounted at the mounting position Pa. In FIG. 4, one of the first field of view V1 and the second field of view V2 is illustrated for the convenience of illustration.

Figure 5:
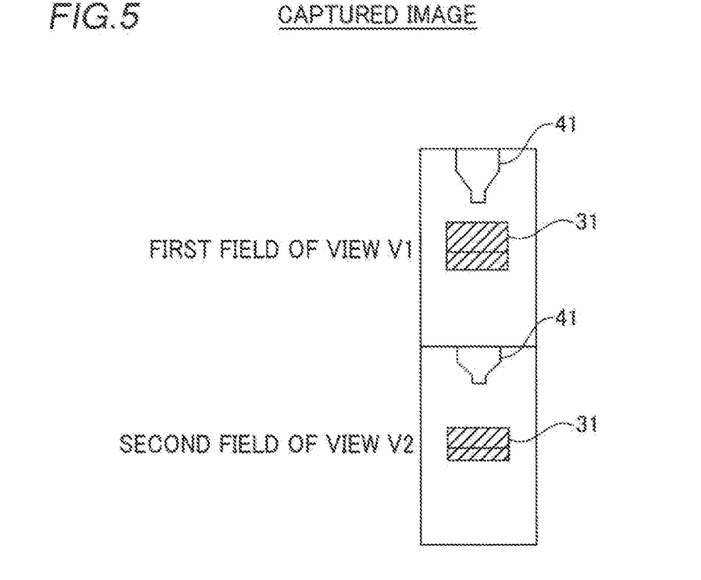
FIG. 5 is a diagram for illustrating a captured image captured from a first field of view and a second field of view of the imaging unit of the component mounting device according to the embodiment of the present disclosure.

Specifically, the imaging unit 8 is configured to image the predetermined region including the mounting position Pa before mounting of the component 31 from each of the first field of view V1 and the second field of view V2 when a mounting head 42 suctions the component 31 and moves down toward the mounting position Pa before mounting the suctioned component 31 at the mounting position Pa on the substrate P. Furthermore, the imaging unit 8 is configured to image the predetermined region including the mounting position Pa after mounting of the component 31 when the mounting head 42 moves up from the mounting position Pa after mounting the component 31 at the mounting position Pa on the substrate P. Thus, the predetermined region including the mounting position Pa before and after mounting can be imaged during upward movement and downward movement of the mounting head 42, and hence occurrence of a loss due to imaging for success or failure determination can be suppressed unlike the case where the mounting head 42 is stopped to image the predetermined region including the mounting position Pa before and after mounting. In this case, as shown in FIG. 5, the imaging unit 8 is configured to capture images from the first field of view V1 and the second field of view V2 at a time (simultaneously). In FIG. 5, a captured image of the predetermined region including the mounting position Pa after mounting of the component 31 is shown.

(Success or Failure Determination for Mounted Component)

According to the present embodiment, the controller 9 is configured to select a success or failure determination field of view used for determination of whether or not the component 31 has been normally mounted at the mounting position Pa from the first field of view V1 and the second field of view V2 according to the states of shields Sa to Sd (see FIGS. 6 to 9) around the mounting position Pa.

Specifically, the controller 9 is configured to acquire, from the imaging unit 8, an imaging result from the first field of view V1 and an imaging result from the second field of view V2, and to select an imaging result from the success or failure determination field of view from the acquired imaging result from the first field of view V1 and the acquired imaging result from the second field of view V2 according to the states of the shields Sa to Sd (see FIGS. 6 to 9) around the mounting position Pa.

Figure 6:
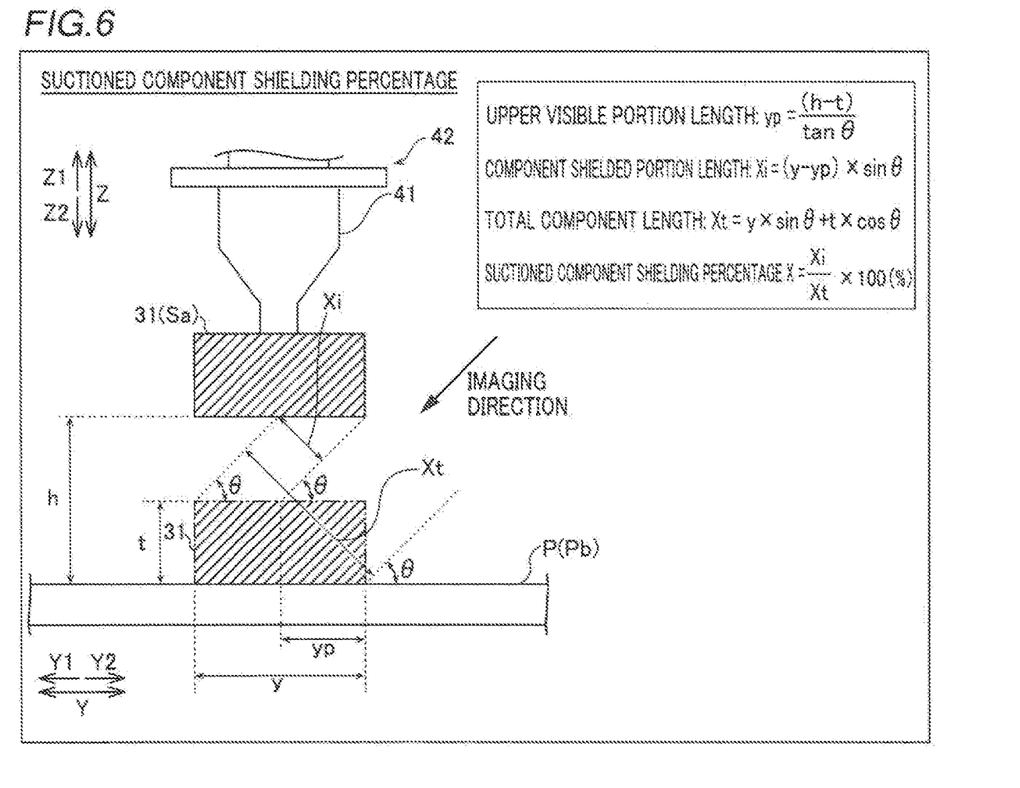
FIG. 6 is a diagram for illustrating a calculation method for a suctioned component shielding percentage to be calculated for selecting a success or failure determination field of view in the component mounting device according to the embodiment of the present disclosure.
Figure 7:
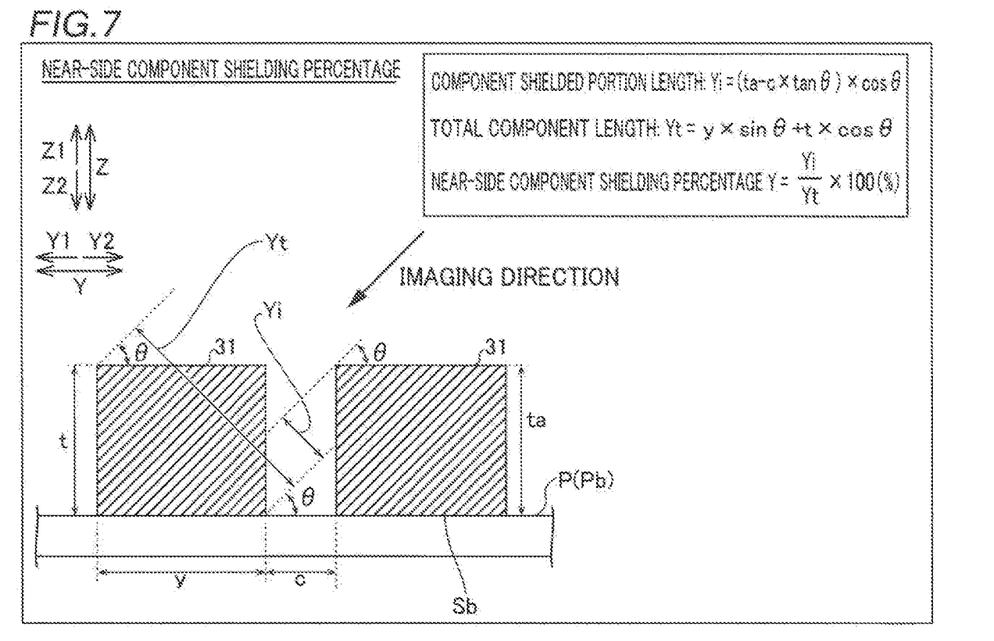
FIG. 7 is a diagram for illustrating a calculation method for a near-side component shielding percentage to be calculated for selecting the success or failure determination field of view in the component mounting device according to the embodiment of the present disclosure.
Figure 8:
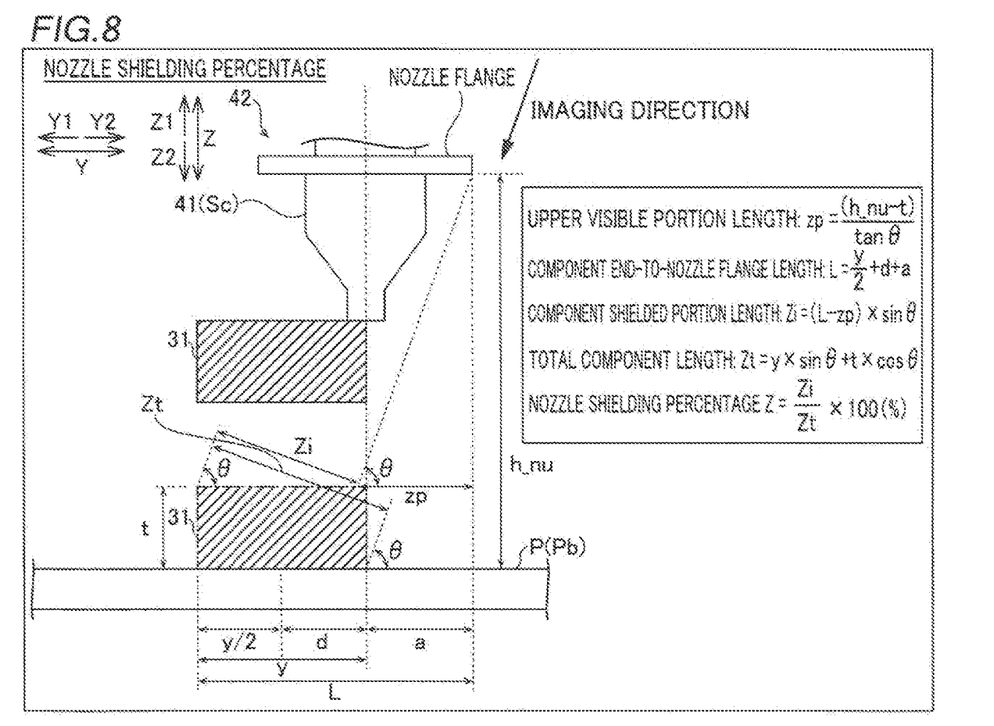
FIG. 8 is a diagram for illustrating a calculation method for a nozzle shielding percentage to be calculated for selecting the success or failure determination field of view in the component mounting device according to the embodiment of the present disclosure.
Figure 9:
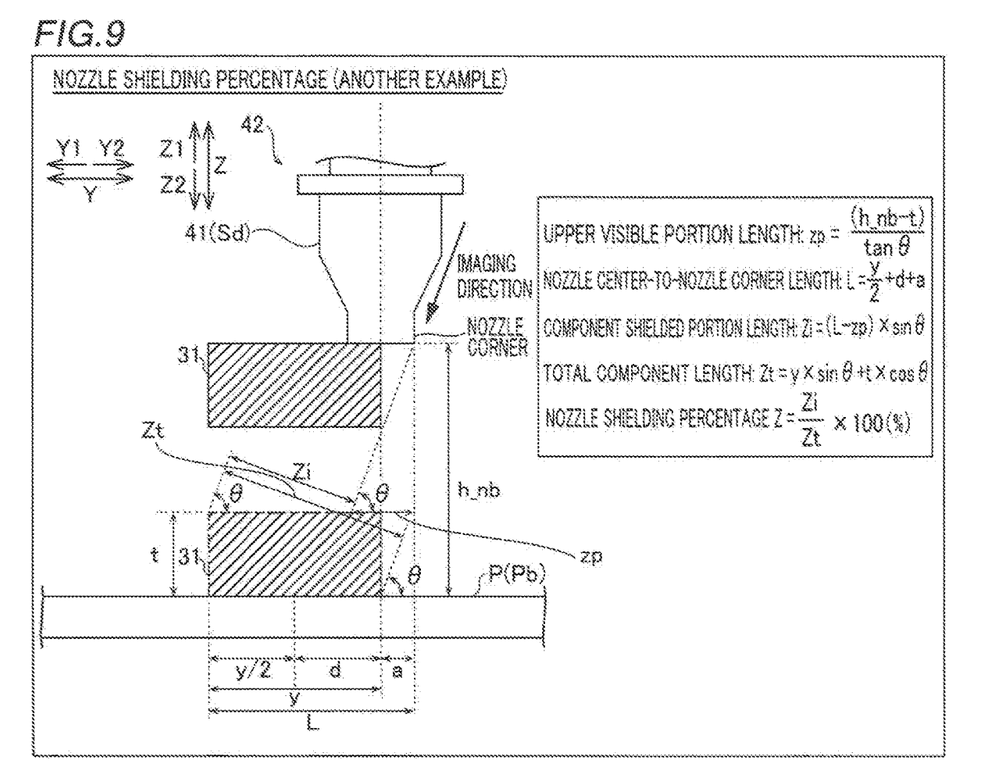
FIG. 9 is a diagram for illustrating another example of a calculation method for a nozzle shielding percentage to be calculated for selecting the success or failure determination field of view in the component mounting device according to the embodiment of the present disclosure.

As shown in FIG. 6, the shield Sa is a component 31 (suctioned component) before mounting, which is suctioned by the mounting head 42. As shown in FIG. 7, the shield Sb is a component 31 (near-side component) that has already been mounted on the substrate P around the mounting position Pa. As shown in FIGS. 8 and 9, the shield Sc and the shield Sd each are the nozzle 41 of the mounting head 42 that has suctioned the component 31.

The controller 9 is configured to make a success or failure determination based on the captured image of the predetermined region including the mounting position Pa before mounting of the component 31 from the selected success or failure determination field of view and the captured image of the predetermined region including the mounting position Pa after mounting of the component 31. Specifically, as shown in FIG. 4, the controller 9 is configured to set a determination frame D (shown by a two-dot chain line) used for success or failure determination in the captured images of the predetermined region including the mounting position Pa, to generate a difference image between the captured image before mounting of the component 31 in the set determination frame D and the captured image after mounting of the component 31 in the set determination frame D, and to make a success or failure determination based on the generated difference image. The determination frame D is an example of a "determination region" in the present disclosure.

(Acquisition of Degree of Shielding)

According to the present embodiment, the controller 9 is configured to acquire the degrees of shielding of the shields Sa to Sd in each of the first field of view V1 and the second field of view V2 according to the states of the shields Sa to Sd around the mounting position Pa and to select a success or failure determination field of view less affected by shielding of the shields Sa to Sd from the first field of view V1 and the second field of view V2 based on the acquired degrees of shielding.

A method for acquiring the degree of shielding of each of the shields Sa to Sd in each of the first field of view V1 and the second field of view V2 is described below with reference to FIGS. 6 to 8. Here, a method for acquiring, as the degree of shielding, a percentage (shielding percentage=component shielded portion length/total component length×100(%)) of the size of a shielded portion (component shielded portion length) of the component 31 after mounting shielded by each of the shields Sa to Sd when the shields Sa to Sd are present and the field of view (the first field of view V1 or the second field of view V2) is shielded by each of the shields Sa to Sd relative to the total size (total component length) of the component 31 after mounting capable of being imaged by the imaging unit 8 when the field of view (the first field of view V1 or the second field of view V2) is not shielded by any of the shields Sa to Sd is described. In the description of FIGS. 6 to 8, the first field of view V1 and the second field of view V2 are simply described as the field of view, and the inclination angle θH (see FIG. 2) of the first field of view V1 and the inclination angle θL (see FIG. 2) of the second field of view V2 are simply described as θ.

Acquisition of Suctioned Component Shielding Percentage

First, the shield Sa, which is a component 31 (suctioned component) before mounting suctioned by the mounting head 42, is described with reference to FIG. 6. In the case of the shield Sa (suctioned component), a portion of the field of view used for success or failure determination is partially (i.e. a portion of a component shielded portion length Xi) shielded by the shield Sa at the timing when an image to be captured before mounting is captured. In this case, a suctioned component shielding percentage can be calculated (acquired) as described below.

That is, the imaging height of the component 31 (shield Sa) at the time of imaging by the imaging unit 8 before mounting is set to h, the component thickness of the component 31 in a direction Z is set to t, the component width of the component 31 in the direction Y is set to y, and the imaging angle (inclination angle) of the imaging unit 8 is set to θ (θ=θH or θL). Accordingly, an upper visible portion length yp can be obtained from the following expression (1).

$$yp = (h-t)/\tan\theta \quad (1)$$

Then, using the upper visible portion length yp obtained from the expression (1), the component shielded portion length Xi can be obtained from the following expression (2).

$$Xi = (y-yp) \times \sin\theta \quad (2)$$

Furthermore, a total component length Xt can be obtained from the following expression (3).

$$Xt = y \times \sin\theta + t \times \cos\theta \qquad (3)$$

As a result, the suctioned component shielding percentage X (%) due to the shield Sa (suctioned component) can be obtained from the following expression (4).

$$X = Xi/Xt \times 100 \qquad (4)$$

Acquisition of Near-Side Component Shielding Percentage

Next, the shield Sb, which is a component 31 (near-side component) that has already been mounted on the substrate P around the mounting position Pa, is described with reference to FIG. 7. In the case of the shield Sb (near-side component), a portion of the field of view used for success or failure determination is partially (i.e. a portion of a component shielded portion length Yi) shielded by the shield Sb at the timing when an image to be captured before mounting is captured and at the timing when an image to be captured after mounting is captured. In this case, a near-side component shielding percentage can be calculated (acquired) as described below.

That is, the component thickness of the shield Sb (near-side component) in the direction Z is set to ta, and a component-to-component clearance length between the mounted component 31 and the shield Sb (near-side component) is set to c. Accordingly, the component shielded portion length Yi can be obtained from the following expression (5). The same values as those in FIG. 6 are denoted by the same symbols, and description thereof is omitted.

$$Yi = (ta - c \times \tan\theta) \times \cos\theta \qquad (5)$$

Furthermore, a total component length Yt can be obtained from the following expression (6).

$$Yt = y \times \sin\theta + t \times \cos\theta \qquad (6)$$

As a result, the near-side component shielding percentage Y (%) due to the shield Sb (near-side component) can be obtained from the following expression (7).

$$Y = Yi/Yt \times 100 \qquad (7)$$

Acquisition of Nozzle Shielding Percentage

Next, the shields Sc and Sd, each of which is the nozzle 41 of the mounting head 42 that has suctioned the component 31, are described with reference to FIGS. 8 and 9. In FIGS. 8 and 9, the suction position deviation of the suctioned component 31 with respect to the nozzle 41 is shown in an exaggerated manner for convenience sake. In the case of the shield Sc (nozzle) shown in FIG. 8, when the component 31 is suctioned while being deviated from the nozzle center at the time of suction, a portion of the field of view used for success or failure determination is partially (i.e. a portion of a component shielded portion length Zi) shielded by the shield Sc (nozzle) at the timing when an image to be captured before mounting is captured. In this case, a nozzle shielding percentage can be calculated (acquired) as described below.

That is, a nozzle flange height to a flange of the nozzle 41 at the time of imaging by the imaging unit 8 before mounting is set to h_nu, the suction deviation of the component 31 in the direction Y is set to d, and a nozzle center-to-nozzle flange length from the center of the nozzle 41 to an end of the flange of the nozzle 41 on the Y2 side is set to a. Accordingly, an upper visible portion length zp can be obtained from the following expression (8). The same values as those in FIG. 6 are denoted by the same symbols, and description thereof is omitted.

$$zp = (h\_nu - t)/\tan\theta \qquad (8)$$

Furthermore, a component end-to-nozzle flange length L from an end of the component 31 on the Y1 side to the end of the flange of the nozzle 41 on the Y2 side can be obtained from the following expression (9).

$$L = (y/2) + d + a \qquad (9)$$

Then, using the upper visible portion length zp obtained from the expression (8) and the component end-to-nozzle flange length L obtained from the expression (9), the component shielded portion length Zi can be obtained from the following expression (10).

$$Zi = (L - zp) \times \sin\theta \qquad (10)$$

Furthermore, a total component length Zt can be obtained from the following expression (11).

$$Zt = y \times \sin\theta + t \times \cos\theta \qquad (11)$$

As a result, the nozzle shielding percentage Z (%) due to the shield Sc (nozzle) can be obtained from the following expression (12).

$$Z = Zi/Zt \times 100 \qquad (12)$$

Another Example of Acquisition of Nozzle Shielding Percentage

Although the case where the field of view is shielded by the flange of the shield Sc (nozzle) is illustrated in FIG. 8, the field of view may be shielded by the tip of the nozzle 41 as the shield Sd shown in FIG. 9, depending on the shape of the nozzle 41. In this case, a nozzle corner height to a corner of the tip of the nozzle 41 at the time of imaging by the imaging unit 8 before mounting is set to h_nb, and h_nu in the aforementioned expressions (8) to (12) is replaced by h_nb. Thus, an upper visible portion length zp, a nozzle center-to-nozzle corner length L, a component shielded portion length Zi, a total component length Zt, and a nozzle shielding percentage Z in the case where the field of view is shielded by the tip of the nozzle 41 can be obtained.

The controller 9 is configured in the above manner to acquire the shielding percentage (suctioned component shielding percentage X) in the field of view (the first field of view and the second field of view) due to the shield Sa, the shielding percentage (near-side component shielding percentage Y) in the field of view due to the shield Sb, and the shielding percentage (nozzle shielding percentage Z) in the field of view due to the shield Sc or Sd. Furthermore, the controller 9 is configured to select the success or failure determination field of view less affected by shielding of the shields Sa to Sd from the first field of view V1 and the second field of view V2 based on the acquired shielding percentages.

According to the present embodiment, the controller 9 is configured to select the success or failure determination field of view from the first field of view V1 and the second field of view V2 based on the type of the component 31 to be mounted at the mounting position Pa and the background (the substrate surface Pb of the substrate P) of the component 31 around the mounting position Pa in addition to the acquired shielding percentages. Thus, the success or failure determination field of view, less affected by shielding of the shields Sa to Sd, from which more features of the component 31 can be imaged, can be selected.

(Correction of Determination Frame)

As described above, the controller 9 sets the determination frame D (see FIG. 4) used for success or failure determination in the captured images of the predetermined region including the mounting position Pa and generates the difference image between the captured image before mounting of the component 31 in the set determination frame D and the captured image after mounting of the component 31 in the set determination frame D when making a success or failure determination. At this time, the mounting position Pa may be positionally deviated with respect to the determination frame D when the height position of the substrate surface Pb is changed due to warpage (upward warpage, downward warpage) of the substrate P or when there is a suction deviation in the component 31 suctioned by the nozzle 41 of the mounting head 42, for example.

Figure 10:
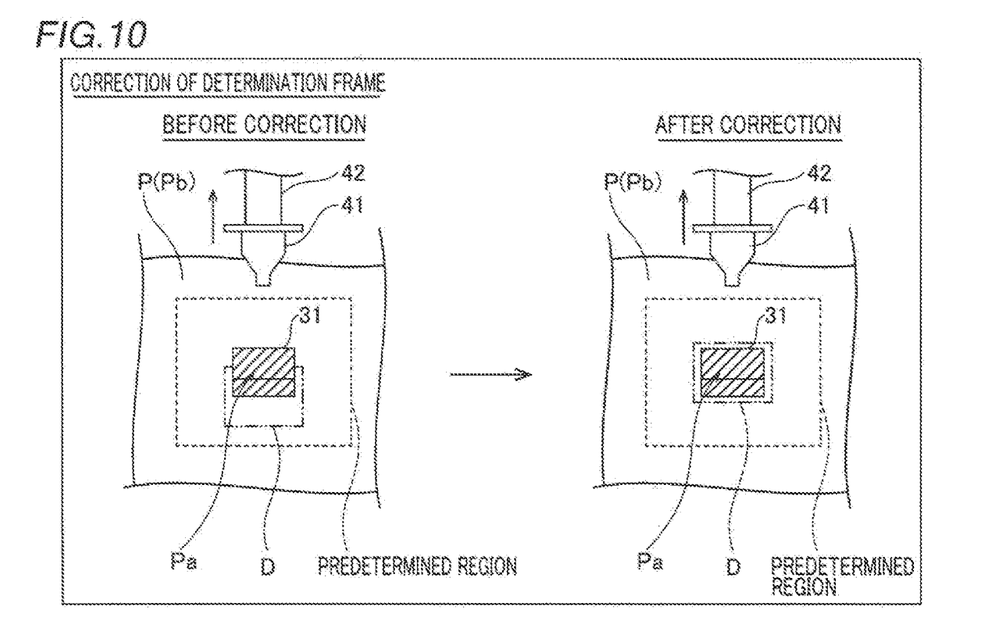
FIG. 10 is a diagram for illustrating the state of a determination frame before correction and the state of the determination frame after correction in the component mounting device according to the embodiment of the present disclosure.

Therefore, according to the present embodiment, as shown in FIG. 10, the controller 9 is configured to correct the position of the determination frame D in the captured image from the success or failure determination field of view based on the height (the substrate surface height hp shown in FIG. 11) of the substrate surface Pb and the suction deviation of the component 31 to include the mounting position Pa in the determination frame D. Furthermore, the controller 9 is configured to generate a difference image between the captured image before mounting of the component 31 in the corrected determination frame D and the captured image after mounting of the component 31 in the corrected determination frame D and to make a success or failure determination based on the generated difference image.

Acquisition of Substrate Height

The controller 9 is configured to acquire the height of the substrate surface Pb of the substrate P with respect to a reference surface Ps (see FIG. 11) by stereo matching based on the captured image from the first field of view V1 and the captured image from the second field of view V2.

Figure 11:
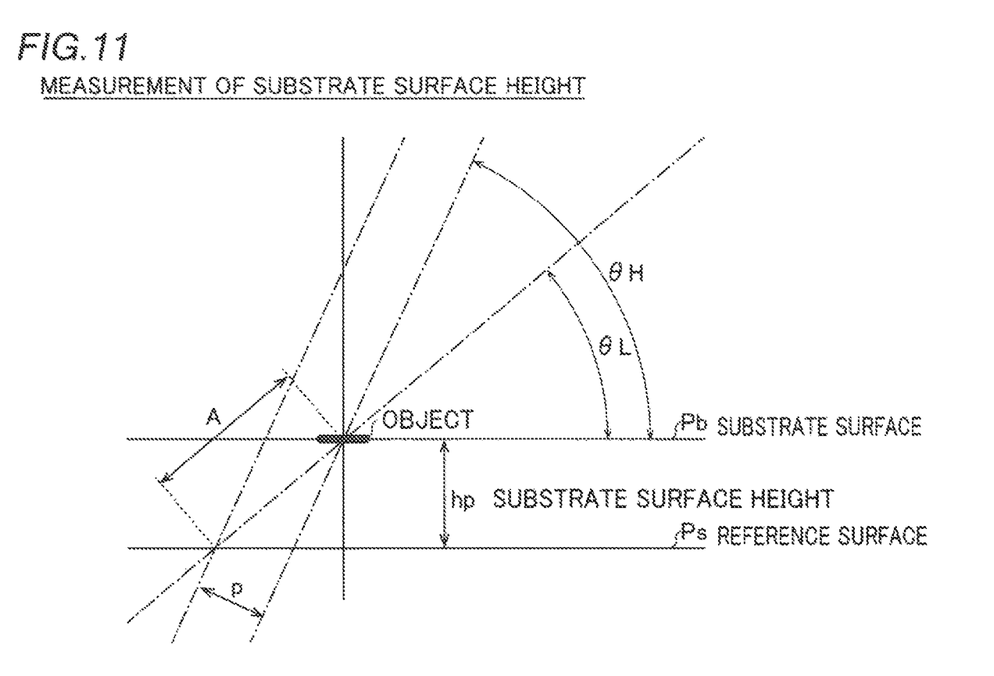
FIG. 11 is a diagram for illustrating a calculation method through stereo matching for a substrate surface height to be calculated for correcting the determination frame in the component mounting device according to the embodiment of the present disclosure.

Specifically, first, an object (a predetermined position on the substrate surface Ps) is imaged at the inclination angle θH from the first field of view V1, and the object is imaged at the inclination angle θL from the second field of view V2, as shown in FIG. 11. Then, stereo matching between the captured image from the first field of view V1 and the captured image from the second field of view V2 is performed such that a parallax p (pixel) between the captured image from the first field of view V1 and the captured image from the second field of view V2 is obtained. Then, assuming that the camera resolution of the success or failure determination camera 81 is R (μm/pixel), a distance $\underline{A}$ (μm) can be obtained from the following expression (13).

$$A = p \times R / \sin(\theta H - \theta L) \quad (13)$$

Then, the substrate surface height hp (μm) of the substrate surface Pb with respect to the reference surface Ps can be obtained from the following expression (14) with the distance $\underline{A}$ obtained from the expression (13).

$$hp = A \times \sin(\theta L) \quad (14)$$

Acquisition of Suction Deviation

The controller 9 is configured to acquire the suction deviation of the component 31 based on the suction state (suction attitude) of the component 31 imaged by the component recognition camera 7. Furthermore, the controller 9 is configured to correct the position of the determination frame D in the captured image from the success or failure determination field of view based on the acquired suction deviation of the component 31 to include the mounting position Pa in the determination frame D.

(Mounting Success or Failure Determination Processing)

Figure 12:
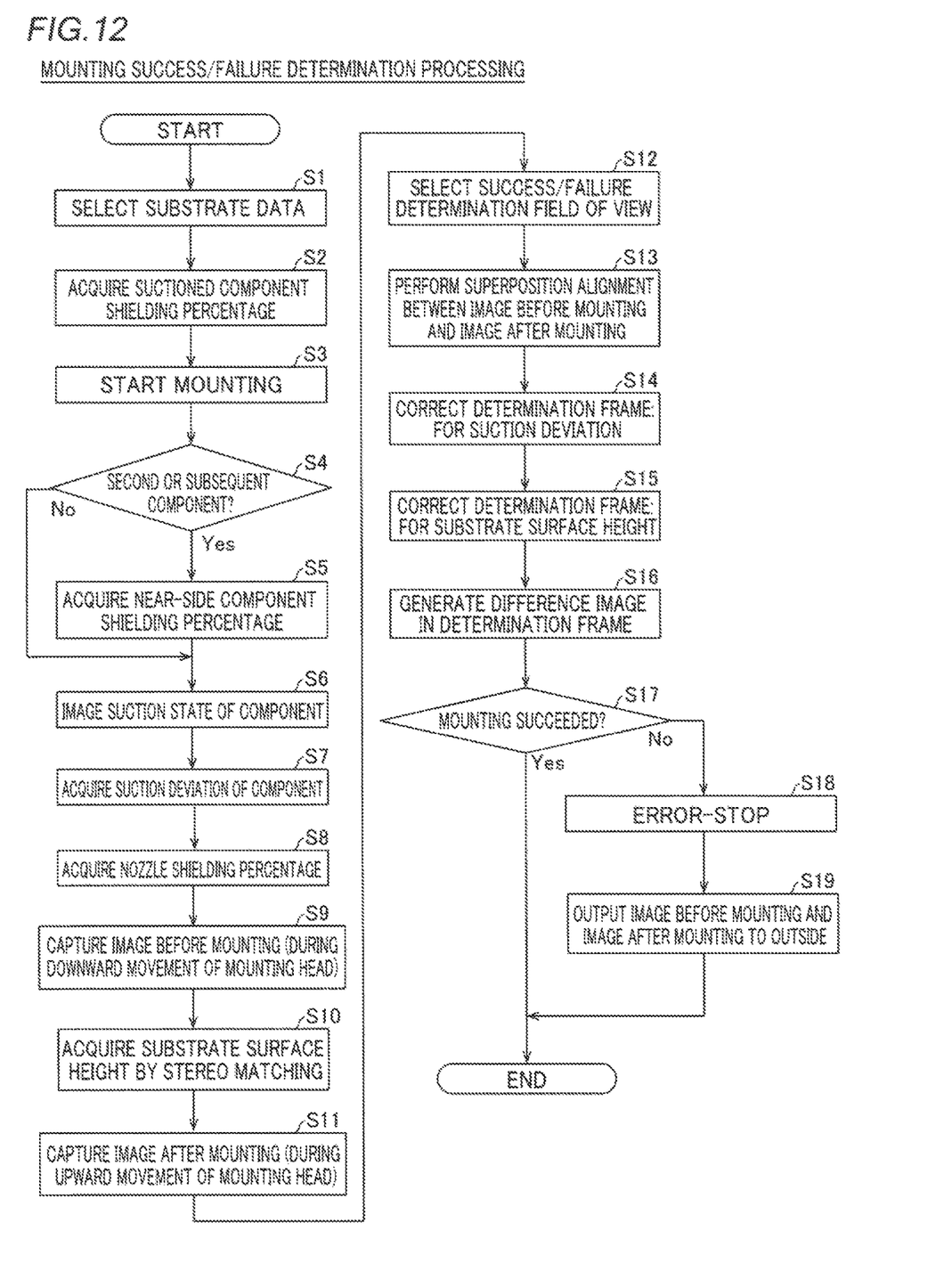
FIG. 12 is a flowchart for illustrating mounting success or failure determination processing in the component mounting device according to the embodiment of the present disclosure.

The aforementioned mounting success or failure determination processing is now described based on a flowchart with reference to FIG. 12. The operation of the component mounting device 100 is performed by the controller 9.

First, in a step S1, substrate data is selected. Thus, information such as the size of the component 31 to be mounted is acquired from this. That is, information such as the mounting position Pa of the component 31, the component thickness t, the component width y, the component thickness to of the near-side component, the component-to-component clearance length c, the nozzle flange height h_nu, the nozzle corner height h_nb, and the nozzle center-to-nozzle flange (nozzle corner) length $\underline{a}$ is acquired.

Then, in a step S2, the suctioned component shielding percentage X (see FIG. 6) is acquired from the aforementioned expressions (1) to (4). At this time, values set in advance are used as the imaging height h and the imaging angle θ.

Then, in a step S3, an operation of mounting the component 31 performed by the head unit 4 is started. That is, the component 31 is suctioned from the component feeders 3 by the mounting head 42 of the head unit 4.

Then, in a step S4, it is determined whether or not the component 31 to be mounted is the second or subsequent component 31. When determining that the component 31 is the second or subsequent component 31, the controller 9 advances to a step S5.

Then, in the step S5, the near-side component shielding percentage Y (see FIG. 7) is acquired from the aforementioned expressions (5) to (7).

On the other hand, when determining that the component 31 is not the second or subsequent component 31 in the step S4, the controller 9 skips the step S5 and advances to a step S6. That is, when the component 31 to be mounted is the first component, the shield Sb (near-side component) is not present, and hence the controller 9 skips the processing of the step S5 and advances to the step S6.

Then, in the step S6, the suction state (suction attitude) of the component 31 is imaged by the component recognition camera 7.

Then, in a step S7, the suction deviation d (see FIGS. 8 and 9) is acquired based on the suction state of the component 31 imaged by the component recognition camera 7.

Then, in a step S8, the nozzle shielding percentage Z (see FIGS. 8 and 9) is acquired from the aforementioned expressions (8) to (12). At this time, the nozzle shielding percentage Z shown in FIG. 8 or 9 is acquired according to the shape of the nozzle 41.

Then, in a step S9, the predetermined region including the mounting position Pa before mounting is imaged by the imaging unit 8 during downward movement of the mounting head 42. At this time, the predetermined region including the mounting position Pa before mounting is imaged from each of the first field of view V1 and the second field of view V2. Then, the captured image before mounting from the first field of view V1 and the captured image before mounting from the second field of view V2 are acquired.

Then, in a step S10, the substrate surface height hp (see FIG. 11) is acquired by stereo matching from the aforementioned expressions (13) and (14) based on the acquired captured image from the first field of view V1 and the acquired captured image from the second field of view V2. In addition, the component 31 suctioned by the mounting head 42 is mounted at the mounting position Pa on the substrate P between the step S9 and a step S11.

Then, in the step S11, the predetermined region including the mounting position Pa after mounting is imaged by the imaging unit 8 during upward movement of the mounting head 42. Also at this time, the predetermined region including the mounting position Pa after mounting is imaged from each of the first field of view V1 and the second field of view V2. Then, the captured image after mounting from the first field of view V1 and the captured image after mounting from the second field of view V2 are acquired.

Then, in a step S12, a field of view used as the success or failure determination field of view is selected from the first field of view V1 and the second field of view V2 based on three shielding percentages of the suctioned component shielding percentage X acquired in the step S2, the near-side component shielding percentage Y acquired in the step S5, and the nozzle shielding percentage Z acquired in the step S8, the type of the component 31 to be mounted at the mounting position Pa, and the background (the substrate surface Pb of the substrate P) of the component 31 around the mounting position Pa.

Then, in steps S13 to S17, a success or failure determination of whether or not the component 31 has been normally mounted at the mounting position Pa is made based on the captured image before mounting and the captured image after mounting from the selected success or failure determination field of view.

Specifically, in the step S13, superposition alignment between the captured image before mounting and the captured image after mounting is performed.

In the steps S14 and S15, the position of the determination frame D is corrected. In the step S14, the position of the determination frame D is corrected based on the suction deviation of the component 31 imaged by the component recognition camera 7 with respect to the nozzle 41 such that the mounting position Pa is within the determination frame D. In the step S15, the position of the determination frame D is corrected based on the substrate surface height hp acquired in the step S10 such that the mounting position Pa is within the determination frame D.

In the step S16, the difference image between the captured images before and after mounting of the component 31 in the corrected determination frame D is generated.

In the step S17, a success or failure determination of whether or not the component 31 has been normally mounted at the mounting position Pa is made based on the generated difference image. When determining that the component 31 has been normally mounted at the mounting position Pa, the controller 9 terminates the mounting success or failure determination processing. On the other hand, when not determining that the component 31 has been normally mounted at the mounting position Pa, the controller 9 advances to a step S18.

Then, in the step S18, the component mounting device 100 is error-stopped. Thereafter, in a step S19, the captured image before mounting and the captured image after mounting are output to the outside. Thus, a user that uses the component mounting device 100 can confirm what type of abnormality has occurred.

In the aforementioned mounting success or failure determination processing, the suctioned component shielding percentage X, the near-side component shielding percentage Y, and the nozzle shielding percentage Z are sequentially acquired (calculated) in the steps S2, S5, and S8, respectively. In this manner, each of the shielding percentages is acquired (calculated) at the timing when a value for acquiring (calculating) each of the shielding percentages is acquired such that each of the shielding percentages can be acquired while a processing load on the controller 9 is dispersed and reduced, unlike the case where the three shielding percentages are acquired (calculated) at a time in the step S12, for example.

Effects of Present Embodiment

According to the present embodiment, the following effects can be obtained.

According to the present embodiment, as hereinabove described, the controller 9 is configured to select the success or failure determination field of view used for success or failure determination of whether or not the component 31 has been mounted at the mounting position Pa from the first field of view V1 and the second field of view V2 according to the states of the shields Sa to Sd around the mounting position Pa. Thus, even when the mounting position Pa cannot be accurately imaged from one field of view due to the shields Sa to Sd, the controller 9 can select, as the success or failure determination field of view, the other of the first field of view V1 and the second field of view V2 less affected by shielding of the shields Sa to Sd than one of the first field of view V1 and the second field of view V2. Consequently, a success or failure determination can be made based on the imaging result from the field of view less affected by shielding of the shields Sa to Sd, and hence it can be stably determined whether or not the component 31 has been mounted at the mounting position Pa.

According to the present embodiment, the controller 9 is configured to acquire the degrees of shielding of the shields Sa to Sd in each of the first field of view V1 and the second field of view V2 according to the states of the shields Sa to Sd around the mounting position Pa and to select the success or failure determination field of view from the first field of view V1 and the second field of view V2 based on the acquired degrees of shielding in each of the first field of view V1 and the second field of view V2. Thus, the controller 9 can reliably select, as the success or failure determination field of view, the other of the first field of view and the second field of view less affected by shielding of the shields Sa to Sd than one of the first field of view V1 and the second field of view V2. Consequently, it can be more stably determined whether or not the component 31 has been mounted at the mounting position Pa.

According to the present embodiment, the degrees of shielding are defined as the shielding percentages (the suctioned component shielding percentage X, the near-side component shielding percentage Y, and the nozzle shielding percentage Z), which are the percentages of the sizes of the shielded portions of the component 31 shielded by the shields Sa to Sd with respect to the total size of the component 31. Furthermore, the controller 9 is configured to select the success or failure determination field of view from the first field of view V1 and the second field of view V2 based on the shielding percentages in each of the first field of view V1 and the second field of view V2. Thus, the success or failure determination field of view can be selected in consideration of not only the sizes of the shielded portions but also the total size of the component 31 generally varying from type to type, unlike the case where the success or failure determination field of view is selected based on only the sizes of the shielded portions. Consequently, the influence of shielding of the shields Sa to Sd can be more appropriately evaluated, and hence the success or failure determination field of view less affected by shielding of the shields Sa to Sd can be more reliably selected.

According to the present embodiment, the shields (Sa to Sd) around the mounting position Pa are the component 31

(suctioned component) before mounting suctioned by the mounting head 42, the component 31 (near-side component) mounted on the substrate P around the mounting position Pa, and the nozzle 41 of the mounting head 42 that has suctioned the component 31. Thus, the controller 9 can select the success or failure determination field of view according to the states of three types of the shields (Sa to Sd) of the component 31 before mounting suctioned by the mounting head 42, the component 31 mounted on the substrate P around the mounting position Pa, and the mounting head 42 that has suctioned the component 31, which are likely to be shields that shield the fields of view. Consequently, the controller 9 can reliably select, as the success or failure determination field of view, the field of view less affected by shielding of the shields Sa to Sd from the first field of view V1 and the second field of view V2.

According to the present embodiment, the first field of view V1 and the second field of view V2, the imaging directions of which are different from each other, are positioned such that the imaging directions thereof are at the different inclination angles (θH and θL) from each other with respect to the substrate surface Pb of the substrate P on which the component 31 is mounted. Thus, the mounting position Pa can be imaged at the different inclination angles, and hence the field of view less affected by shielding of the shields Sa to Sd can be easily set in any of the first field of view V1 and the second field of view V2.

According to the present embodiment, the first field of view V1 and the second field of view V2, the imaging directions of which are different from each other, are positioned adjacent to each other in the vertical plane (in the YZ plane) with respect to the substrate surface Pb. Thus, the first field of view V1 and the second field of view V2 can be compactly positioned as compared with the case where the first field of view V1 and the second field of view V2 are positioned apart from each other in a direction parallel to the substrate surface Pb. Consequently, the field of view less affected by shielding of the shields Sa to Sd can be easily set in any of the first field of view V1 and the second field of view V2 while an increase in the size of the imaging unit 8 is suppressed.

According to the present embodiment, the success or failure determination camera 81 that images the mounting position Pa and the optical systems 83 that divide the field of view of the success or failure determination camera 81 into the first field of view V1 and the second field of view V2, the imaging directions of which are different from each other, are provided in the imaging unit 8. Thus, unlike the case where the first field of view V1 and the second field of view V2 are imaged with a plurality of success or failure determination cameras, the first field of view V1 and the second field of view V2 can be imaged with the single success or failure determination camera 81. Consequently, the first field of view V1 and the second field of view V2 can be imaged while complication of the structure of the success or failure determination camera 81 of the imaging unit 8 is suppressed.

According to the present embodiment, the optical system 82 that divides the field of view of the success or failure determination camera 81 into each of the plurality of optical systems 83 is provided in the imaging unit 8. Thus, unlike the case where the first field of view V1 and the second field of view V2 are imaged for each of the mounting heads 42 with a plurality of success or failure determination cameras, the first field of view V1 and the second field of view V2 can be imaged for each of the mounting heads 42 with the single success or failure determination camera 81. Consequently, the first field of view V1 and the second field of view V2 can be imaged for each of the mounting heads 42 while complication of the structure of the success or failure determination camera 81 of the imaging unit 8 is suppressed. Furthermore, in the structure in which the imaging unit 8 is fixed to the head unit 4 that is movable in the directions X and Y as the component mounting device 100 according to the present embodiment, in addition to the weight of the head unit 4 itself, the weight of the fixed imaging unit 8 is preferably reduced from the viewpoint of facilitating movement of the head unit 4. Therefore, as described above, complication of the structure of the success or failure determination camera 81 of the imaging unit 8 is suppressed, and an increase in the number of success or failure determination cameras 81 and an increase in the number of components such as cables attached to the success or failure determination camera 81 are suppressed such that an increase in the weight of the imaging unit 8 can be very effectively suppressed.

According to the present embodiment, the controller 9 is configured to acquire, from the imaging unit 8, the respective captured images from the first field of view V1 and the second field of view V2 and to select, from the acquired respective captured images from the first field of view V1 and the second field of view V2, the captured image from the success or failure determination field of view according to the states of the shields Sa to Sd around the mounting position Pa. Thus, the controller 9 can easily select, as the success or failure determination field of view, the other of the first field of view V1 and the second field of view V2 less affected by shielding of the shields Sa to Sd than one of the first field of view V1 and the second field of view V2, and hence it can be easily and stably determined whether or not the component 31 has been mounted at the mounting position Pa.

According to the present embodiment, the controller 9 is configured to select the success or failure determination field of view from the first field of view V1 and the second field of view V2 according to the type of the component 31 to be mounted at the mounting position Pa or the background of the component 31 around the mounting position Pa in addition to the states of the shields Sa to Sd around the mounting position Pa. Thus, the success or failure determination field of view can be selected in consideration of the type of the component 31 to be mounted at the mounting position Pa or the background around the mounting position Pa, and hence the field of view less affected by shielding of the shields Sa to Sd, from which more features of the component 31 can be imaged, can be easily selected.

According to the present embodiment, the imaging unit 8 is configured to image the mounting position Pa before mounting of the component 31 and the mounting position Pa after mounting of the component 31 from each of the first field of view V1 and the second field of view V2. Furthermore, the controller 9 is configured to make a success or failure determination based on the captured image of the mounting position Pa before mounting of the component 31 from the success or failure determination field of view and the captured image of the mounting position Pa after mounting of the component 31 from the success or failure determination field of view, both of which have been selected from the respective captured images from the first field of view V1 and the second field of view V2. Thus, the controller 9 can easily make a success or failure determination based on the selected captured images of the mounting position Pa before and after mounting of the component 31 from the success or failure determination field of view.

According to the present embodiment, the controller 9 is configured to acquire the height of the substrate surface Pb of the substrate P with respect to the reference surface Ps based on the captured image of the mounting position Pa from each of the first field of view V1 and the second field of view V2 and to correct the determination frame D used for success or failure determination in the captured image from the success or failure determination field of view based on the acquired height of the substrate surface Pb. Thus, even when the height of the substrate surface Pb of the substrate P with respect to the reference surface Ps changes due to warpage of the substrate P, for example, such that the mounting position Pa is positionally deviated with respect to the determination frame D, the controller 9 can appropriately make a success or failure determination by correcting the determination frame D.

Modifications

The embodiment disclosed this time must be considered as illustrative in all points and not restrictive. The range of the present disclosure is shown not by the above description of the embodiment but by the scope of claims for patent, and all modifications within the meaning and range equivalent to the scope of claims for patent are further included.

For example, while the example in which the imaging unit 8 is configured to be capable of imaging the mounting position Pa from the first field of view V1 and the second field of view V2 has been shown in the aforementioned embodiment, the present disclosure is not restricted to this. According to the present disclosure, the imaging unit may be configured to be capable of imaging the mounting position from three fields of view.

While the example in which the imaging unit 8 is configured to be capable of imaging the mounting position Pa from the first field of view V1 and the second field of view V2 with the single success or failure determination camera 81 has been shown in the aforementioned embodiment, the present disclosure is not restricted to this. According to the present disclosure, the imaging unit may be configured to be capable of imaging the mounting position from a plurality of fields of view with a plurality of success or failure determination cameras.

While the example in which the imaging unit 8 is configured to capture images from the first field of view V1 and the second field of view V2 at a time has been shown in the aforementioned embodiment, the present disclosure is not restricted to this. According to the present disclosure, the imaging unit may be configured to select the success or failure determination field of view and thereafter capture an image only from the selected one field of view.

While the example in which the imaging unit 8 is configured to be capable of imaging the mounting position Pa from the first field of view V1 and the second field of view V2 for each of the mounting heads 42 with the single success or failure determination camera 81 has been shown in the aforementioned embodiment, the present disclosure is not restricted to this. According to the present disclosure, the success or failure determination camera may be provided for each of the mounting heads.

While the example in which the single imaging unit 8 is provided on the head unit 4 including the plurality of (five) mounting heads 42 has been shown in the aforementioned embodiment, the present disclosure is not restricted to this. According to the present disclosure, a plurality of imaging units may be provided for one head unit according to the number of mounting heads. When a head unit includes ten mounting heads, for example, two imaging units 8 according to the aforementioned embodiment may be provided for this head unit.

While the example in which the field of view of the success or failure determination camera 81 is divided into the first field of view V1 and the second field of view V2 by the optical systems 83 each including the prism 83a and the pair of mirrors 83b has been shown in the aforementioned embodiment, the present disclosure is not restricted to this. According to the present disclosure, the field of view of the success or failure determination camera may be divided into a plurality of fields of view by optical systems other than the optical systems shown in the aforementioned embodiment. For example, the field of view of the success or failure determination camera may be divided into a plurality of fields of view by optical systems such as optical systems including mirrored prisms, optical systems including only prisms, or optical systems including only mirrors.

While the example in which the shielding percentages such as the suctioned component shielding percentage X, the near-side component shielding percentage Y, and the nozzle shielding percentage Z are used as the degrees of shielding has been shown in the aforementioned embodiment, the present disclosure is not restricted to this. According to the present disclosure, other than the shielding percentages may be used as the degree of shielding. For example, the size of the shielded portion shielded by the shield, such as the component shielded portion length Xi (Yi, Zi), may be used as the degree of shielding.

While the example in which three types of the component 31 (suctioned component) before mounting suctioned by the mounting head 42, the component 31 (near-side component) that has already been mounted on the substrate P around the mounting position Pa, and the nozzle 41 of the mounting head 42 that has suctioned the component 31 are used as the shields Sa to Sd has been shown in the aforementioned embodiment, the present disclosure is not restricted to this. According to the present disclosure, a shield other than the aforementioned three types may be taken into account. Alternatively, any one of the aforementioned three types or combinations of any two of the aforementioned three types may be used.

While the example in which the position of the determination frame D is corrected based on the height of the substrate surface Pb and the suction deviation of the component 31 such that the mounting position Pa is within the determination frame D has been shown in the aforementioned embodiment, the present disclosure is not restricted to this. According to the present disclosure, the shape of the determination frame may be corrected such that the mounting position Pa is within the determination frame.

While the processing performed by the controller 9 is described, using the flowchart described in a flow-driven manner in which processing is performed in order along a processing flow for the convenience of illustration in the aforementioned embodiment, the present disclosure is not restricted to this. According to the present disclosure, the processing performed by the controller 9 may be performed in an event-driven manner in which processing is performed on an event basis. In this case, the processing may be performed in a complete event-driven manner or in a combination of an event-driven manner and a flow-driven manner.

The invention claimed is:

1. A component mounting device comprising:
a mounting head that mounts a component at a mounting position on a substrate;
an imaging unit capable of imaging the mounting position from a plurality of fields of view, imaging directions of which are different from each other; and
a controller that selects one of the plurality of fields of view as a success or failure determination field of view used for success or failure determination of whether or not the component has been mounted at the mounting position according to a state of a shield around the mounting position, wherein
the shield around the mounting position includes a nozzle of the mounting head that has suctioned the component, and
the controller is configured to acquire a nozzle shielding percentage in each of the plurality of fields of view, to select the success or failure determination field of view from the plurality of fields of view at least based on the nozzle shielding percentage acquired from the controller in each of the plurality of fields of view, and to perform the success or failure determination based on the success or failure determination field of view that is selected from among the plurality of fields of view.

2. The component mounting device according to claim 1, wherein
the shield around the mounting position includes, in addition to the nozzle of the mounting head that suctioned the component, at least one shield of the component before mounting the component suctioned by the mounting head and the component mounted on the substrate around the mounting position.

3. The component mounting device according to claim 1, wherein
the plurality of fields of view, the imaging directions of which are different from each other, are positioned such that the imaging directions of the plurality of fields of view are at different inclination angles from each other with respect to a substrate surface of the substrate on which the component is mounted.

4. The component mounting device according to claim 3, wherein
the plurality of fields of view, the imaging directions of which are different from each other, are positioned adjacent to each other in a vertical plane with respect to the substrate surface.

5. The component mounting device according to claim 1, wherein
the imaging unit includes:
an imaging section that images the mounting position, and
a first optical system that divides a field of view of the imaging section into the plurality of fields of view, the imaging directions of which are different from each other.

6. The component mounting device according to claim 5, wherein
the mounting head includes a plurality of mounting heads,
the first optical system of the imaging unit includes a plurality of first optical systems that correspond in number to the plurality of mounting heads, and
the imaging unit further includes a second optical system that divides the field of view of the imaging section into each of the plurality of first optical systems.

7. The component mounting device according to claim 1, wherein
the controller is configured to acquire, from the imaging unit, respective captured images from the plurality of fields of view and to select, from the respective captured images from the plurality of fields of view, a captured image from the success or failure determination field of view according to the state of the shield around the mounting position.

8. The component mounting device according to claim 1, wherein
the controller is configured to select the success or failure determination field of view from the plurality of fields of view according to at least one of a type of the component to be mounted at the mounting position and a background of the component around the mounting position in addition to the state of the shield around the mounting position.

9. The component mounting device according to claim 1, wherein
the imaging unit is configured to image the mounting position before mounting of the component and to image the mounting position after mounting of the component from each of the plurality of fields of view, and
the controller is configured to make the success or failure determination based on a captured image of the mounting position before mounting of the component from the success or failure determination field of view and a captured image of the mounting position after mounting of the component from the success or failure determination field of view, both of which have been selected from respective captured images from the plurality of fields of view.

10. The component mounting device according to claim 1, wherein
the controller is configured to acquire a height of a substrate surface of the substrate with respect to a reference surface based on a captured image of the mounting position from each of the plurality of fields of view and to correct a determination region used for the success or failure determination in a captured image from the success or failure determination field of view based on the acquired height of the substrate surface.

* * * * *